(12) United States Patent
Herner et al.

(10) Patent No.: US 8,349,663 B2
(45) Date of Patent: Jan. 8, 2013

(54) VERTICAL DIODE BASED MEMORY CELLS HAVING A LOWERED PROGRAMMING VOLTAGE AND METHODS OF FORMING THE SAME

(75) Inventors: S. Brad Herner, San Jose, CA (US); Tanmay Kumar, Pleasanton, CA (US)

(73) Assignee: SanDisk 3D LLC, Milpitas, CA (US)

( * ) Notice: Subject to any disclaimer, the term of this patent is extended or adjusted under 35 U.S.C. 154(b) by 548 days.

(21) Appl. No.: 11/864,848

(22) Filed: Sep. 28, 2007

(65) Prior Publication Data

US 2009/0085154 A1    Apr. 2, 2009

(51) Int. Cl.
    *H01L 21/82* (2006.01)
(52) U.S. Cl. ........ 438/131; 438/380; 438/682; 438/378; 257/530; 257/591; 257/E21.613
(58) Field of Classification Search .................. 257/329, 257/330, 104, 530, 591, E21.613; 438/131, 438/380, 378
    See application file for complete search history.

(56) References Cited

U.S. PATENT DOCUMENTS

| | | | |
|---|---|---|---|
| 5,766,989 A | 6/1998 | Maegawa et al. | |
| 5,915,167 A | 6/1999 | Leedy | |
| 6,180,444 B1 | 1/2001 | Gates et al. | |
| 6,369,431 B1 | 4/2002 | Gonzalez et al. | |
| 6,521,492 B2 | 2/2003 | Miyasaka et al. | |
| 6,946,719 B2 | 9/2005 | Petti et al. | |
| 6,952,030 B2 | 10/2005 | Herner et al. | |
| 7,172,840 B2 | 2/2007 | Chen | |
| 7,176,064 B2 | 2/2007 | Herner | |
| 7,405,465 B2 | 7/2008 | Herner et al. | |
| 7,575,984 B2 | 8/2009 | Radigan | |
| 2003/0045074 A1 | 3/2003 | Seibel et al. | |
| 2003/0049894 A1 | 3/2003 | Berger et al. | |
| 2003/0124802 A1 | 7/2003 | Johnson et al. | |
| 2004/0188798 A1 | 9/2004 | Knall et al. | |
| 2004/0206996 A1 | 10/2004 | Lee et al. | |
| 2005/0052915 A1 | 3/2005 | Herner et al. | |
| 2005/0098800 A1 | 5/2005 | Herner et al. | |
| 2005/0121742 A1* | 6/2005 | Petti et al. ...................... 257/530 |
| 2005/0121743 A1* | 6/2005 | Herner ........................... 257/530 |
| 2005/0221200 A1 | 10/2005 | Chen | |

(Continued)

OTHER PUBLICATIONS

S. Luby, "Cobalt Disilicide-Induced Crystallization of Amorphous Silicon under XeCl Excimer Laser Irradiation" Laser Physics, vol. 8, No. 1, 1998, pp. 259-264.*

(Continued)

*Primary Examiner* — Evan Pert
*Assistant Examiner* — Mark A Laurenzi
(74) *Attorney, Agent, or Firm* — Dugan & Dugan, PC

(57) ABSTRACT

In a first aspect, a method for forming a non-volatile memory cell is provided. The method includes (1) forming a metal-insulator-metal (MIM) antifuse stack including (a) a first metal layer; (b) a silicon dioxide, oxynitride or silicon nitride antifuse layer formed above the first metal layer; and (c) a second metal layer formed above the antifuse layer. The method also includes (2) forming a contiguous p-i-n diode above the MIM antifuse stack, the contiguous p-i-n diode comprising deposited semiconductor material; (3) forming a layer of a silicide, silicide-germanide, or germanide in contact with the deposited semiconductor material; and (4) crystallizing the deposited semiconductor material in contact with the layer of silicide, silicide-germanide, or germanide. The memory cell comprises the contiguous p-i-n diode and the MIM antifuse stack. Other aspects are provided.

41 Claims, 5 Drawing Sheets

U.S. PATENT DOCUMENTS

| | | | |
|---|---|---|---|
| 2005/0226067 | A1 | 10/2005 | Herner et al. |
| 2006/0006495 | A1 | 1/2006 | Herner et al. |
| 2006/0249753 | A1 | 11/2006 | Herner et al. |
| 2006/0250836 | A1 | 11/2006 | Herner |
| 2007/0069217 | A1 | 3/2007 | Herner |
| 2007/0072360 | A1 | 3/2007 | Kumar et al. |
| 2007/0087508 | A1 | 4/2007 | Herner |
| 2007/0190722 | A1 | 8/2007 | Herner |
| 2009/0086521 | A1 | 4/2009 | Herner et al. |

OTHER PUBLICATIONS

Takamura et al., Physical Processes Associated with the Deactivation of Dopants in Laserannealed Silicon, Journal of Applied Physics, vol. 92, p. 235-244, 2002.

Thompson et al., Epitaxial Si-based tunnel diodes, Thin Solid Films 380 (2000), pp. 145-150.

Owen, AE., et al., "Memory Switching in Amorphous Silicon Devices", Journal of Non-Crvstalline Solids, 59 &60, (1983), 1273-1280, North Holland Publishing Company.

Tsuno, M., et al., "Suppression of reverse-short-channel effect in sub-0.1 µm n-MOSFETs with Sb S/D implantation", Electronics Letters, Mar. 18, 1999, Vol. 35., No. 6 pp. 508-509.

Nebel et al. "Pulsed-Laser Crystallized Highly Conductive Boron-Doped Microcrystalline Silicon," Materials Research Society Symposium Proceedings, 1997, pp. 331-336, vol. 467, Materials Research Society.

Delli Veneri et al. "Application of Nd:YLF laser to amorphous silicon crystallization process," Materials Science and Engineering B, 2000, pp. 227-231, vol. 69-70, Elsevier Science S.A.

Wohllebe et al. "Crystallization of amorphous Si films for thin film solar cells," Journal of Non-Crystalline Solids, 1998, pp. 925-929, vol. 227-230, Elsevier Science B.V.

Shibahara, K, et al., "Low Resistive Ultra Shallow Junction for Sub 0.1 µm MOSFETs Formed by Sb implantation", Electron Devices Meeting, 1996, International Dec. 8-11, 1996, pp. 579-582.

Nerding et al. "Grain populations in laser-crystallised silicon thin films on glass substrates," Thin Solid Films, 2001, pp. 110-112, vol. 383, Elsevier Science B.V.

Alzanki et al., "Concentration Profiles of Antimony-Doped Shallow Layers in Silicon", Semiconductor Science and Technology, IPO, Bristol, GB, vol. 19, No. 6, Jun. 1, 2004, pp. 728-732.

OA dated Mar. 14, 2008 (U.S. Appl. No. 11/271,078).

OA dated May 16, 2007 (U.S. Appl. No. 11/271,078).

FOA dated Jan. 14, 2009 (U.S. Appl. No. 11/271,078).

OA dated Oct. 9, 2007 (U.S. Appl. No. 11/303,229).

FOA dated May 13, 2008 (U.S. Appl. No. 11/303,229).

FOA dated Oct. 15, 2008 (U.S. Appl. No. 11/303,229).

(PCT/US2006/048242) Written Opinion dated Jun. 16, 2008.

(PCT/US2006/048242) International Search Report dated Jul. 12, 2007.

(PCT/US06/043482) IPRP dated May 22, 2008.

(PCT/US06/043482) ISR and WO dated May 23, 2007.

EPC (06837153.3) OA dated Jan. 19, 2009.

International Search Report and Written Opinion Application No. PCT/US2008/077960 mailed Apr. 28, 2009.

Herner et al., "Polysilicon Memory Switching: Electrothermal-Induced Order", IEEE Transactions on Electron Devices, vol. 53, No. 9, Sep. 2006, pp. 2320-2327.

EPO Communication of counterpart Application No. 08836291.8 dated May 7, 2010.

Jun. 7, 2010 Reply to EPO Communication of counterpart Application No. 08836291.8 dated May 7, 2010.

Office Action of counterpart Chinese Patent Application No. 200880118435.0 mailed Aug. 5, 2011.

Second Office Action of counterpart Chinese Patent Application No. 200880118435.9 mailed Mar. 26, 2012.

Extended European Search Report of counterpart European Patent Application No. 08836291.8 mailed Feb. 21, 2012.

May 26, 2012 Reply to Mar. 26, 2012 Office Action of counterpart Chinese Patent Application No. 200880118435.9.

Office Action of counterpart Chinese Patent Application No. 200880118435.9 dated Jul. 4, 2012.

Dec. 16, 2011 Reply to Aug. 5, 2011 Office Action of counterpart Chinese Patent Application No. 200880118435.9.

Sep. 11, 2012 Response to Jul. 4, 2012 Office Action of counterpart Chinese Patent Application No. 200880118435.9.

* cited by examiner

Embodiment of 6,952,030

VERTICAL DIODE BASED MEMORY CELLS HAVING A LOWERED PROGRAMMING VOLTAGE AND METHODS OF FORMING THE SAME

RELATED APPLICATIONS

This application is related to Herner, U.S. patent application Ser. No. 11/864,870, "MULTIPLE ANTIFUSE MEMORY CELLS AND METHODS TO FORM, PROGRAM, AND SENSE THE SAME," filed on even date herewith, owned by the assignee of the present application and hereby incorporated by reference herein in its entirety.

This application is also related to Herner, U.S. patent application Ser. No. 10/954,510, "Memory Cell Comprising a Semiconductor Junction Diode Crystallized Adjacent to a Silicide," filed Sep. 29, 2004, hereinafter the '510 application, which is a continuation-in-part of Petti et al., U.S. Pat. No. 6,946,719, "Semiconductor Device Including Junction Diode Contacting Contact-Antifuse Unit Comprising Silicide," both owned by the assignee of the present invention and both hereby incorporated by reference herein in their entirety.

BACKGROUND OF THE INVENTION

The invention relates to a nonvolatile memory cell including a diode and a dielectric rupture antifuse formed electrically in series between conductors. In general, it is advantageous to minimize the voltage required to program such a memory cell.

SUMMARY OF THE INVENTION

In a first aspect of the invention, a method for forming a non-volatile memory cell is provided. The method includes (1) forming a metal-insulator-metal (MIM) antifuse stack including (a) a first metal layer; (b) a silicon dioxide, oxynitride or silicon nitride antifuse layer formed above the first metal layer; and (c) a second metal layer formed above the antifuse layer. The method also includes (2) forming a contiguous p-i-n diode above the MIM antifuse stack, the contiguous p-i-n diode comprising deposited semiconductor material; (3) forming a layer of a silicide, silicide-germanide, or germanide in contact with the deposited semiconductor material; and (4) crystallizing the deposited semiconductor material in contact with the layer of silicide, silicide-germanide, or germanide. The memory cell comprises the contiguous p-i-n diode and the MIM antifuse stack.

In a second aspect of the invention, a method is provided for monolithically forming a first memory level above a substrate. The method includes (1) forming a plurality of first substantially parallel, substantially coplanar conductors above the substrate, the first conductors extending in a first direction; and (2) forming a plurality of MIM antifuse stacks above the first conductors, each MIM antifuse stack including (a) a first metal layer; (b) a silicon dioxide, oxynitride or silicon nitride antifuse layer formed above the first metal layer; and (c) a second metal layer formed above the antifuse layer. The method also includes (3) forming a plurality of vertically oriented contiguous p-i-n diodes above the MIM antifuse stacks, each contiguous p-i-n diode comprising semiconductor material crystallized in contact with a silicide, silicide-germanide, or germanide layer; and (4) forming a plurality of second substantially parallel, substantially coplanar conductors above the contiguous p-i-n diodes, the second conductors extending in a second direction different from the first direction, each contiguous p-i-n diode vertically disposed above one of the MIM antifuse stacks and between one of the first conductors and one of the second conductors.

In a third aspect of the invention, a method is provided for forming a monolithic three dimensional memory array above a substrate. The method includes (a) monolithically forming a first memory level above the substrate, the first memory level formed by (i) forming a plurality of first substantially parallel, substantially coplanar conductors extending in a first direction; (ii) forming a plurality of second substantially parallel, substantially coplanar conductors extending in a second direction different from the first direction, the second conductors above the first conductors; (iii) forming a plurality of vertically oriented contiguous p-i-n diodes formed of deposited semiconductor material, the deposited semiconductor material crystallized in contact with a silicide, silicide-germanide, or germanide layer, each diode vertically disposed between one of the first conductors and one of the second conductors; (iv) forming a plurality of metal-insulator-metal (MIM) antifuse stacks; and (v) forming a plurality of memory cells, each memory cell comprising one of the diodes positioned above one of the MIM antifuse stacks arranged in series. Each MIM antifuse stack includes (1) a first metal layer; (2) a silicon dioxide, oxynitride or silicon nitride antifuse layer formed above the first metal layer; and (3) a second metal layer formed above the antifuse layer. The method also includes (b) monolithically forming a second memory level above the first memory level.

In a fourth aspect of the invention, a semiconductor device is provided that includes a metal-insulator-metal (MIM) antifuse stack including (a) a first metal layer; (b) a silicon dioxide, oxynitride or silicon nitride antifuse layer formed above the first metal layer; and (c) a second metal layer formed above the antifuse layer. The semiconductor device also includes a contiguous p-i-n diode formed above the MIM antifuse stack and formed of deposited semiconductor material crystallized adjacent to a silicide, germanide, or silicide-germanide layer.

In a fifth aspect of the invention, a first memory level is provided that includes (1) a plurality of first substantially parallel, substantially coplanar conductors formed above a substrate; (2) a plurality of second substantially parallel, substantially coplanar conductors formed above the first conductors; (3) a plurality of vertically oriented contiguous p-i-n diodes comprising semiconductor material crystallized adjacent to a silicide, silicide-germanide, or germanide layer; and (4) a plurality of metal-insulator-metal (MIM) antifuse stacks positioned below the p-i-n diodes and each including (a) a first metal layer; (b) a silicon dioxide, oxynitride or silicon nitride antifuse layer formed above the first metal layer; and (c) a second metal layer formed above the antifuse layer. Each of the contiguous p-i-n diodes is disposed above one of the MIM antifuse stacks and between one of the first conductors and one of the second conductors. The first memory level also includes a plurality of memory cells, each memory cell comprising one of the contiguous p-i-n diodes and one of the MIM antifuse stacks.

In a sixth aspect of the invention, a monolithic three dimensional memory array is formed above a substrate that includes a first memory level monolithically formed above the substrate, the first memory level having (i) a plurality of first substantially parallel, substantially coplanar conductors extending in a first direction; (ii) a plurality of second substantially parallel, substantially coplanar conductors extending in a second direction different from the first direction, the second conductors above the first conductors; (iii) a plurality of vertically oriented contiguous p-i-n diodes formed of deposited semiconductor material crystallized adjacent to a silicide, silicide-germanide, or germanide layer, each diode vertically disposed between one of the first conductors and one of the second conductors; (iv) a plurality of metal-insulator-metal (MIM) antifuse stacks positioned below the p-i-n diodes and each including (a) a first metal layer; (b) a silicon dioxide, oxynitride or silicon nitride antifuse layer formed above the first metal layer; and (c) a second metal layer formed above the antifuse layer; and (v) a plurality of memory cells, each memory cell comprising one of the diodes and one of the MIM antifuse stacks arranged in series. The monolithic three dimensional memory array also includes a second memory level monolithically formed above the first memory level.

In a seventh aspect of the invention, a device includes (1) a contiguous p-i-n diode comprising semiconductor material; (2) a silicide or silicide-germanide layer in contact with the semiconductor material of the contiguous p-i-n diode; and (3) a metal-insulator-metal (MIM) antifuse stack positioned below the p-i-n diode. The MIM antifuse stack includes (a) a first metal layer; (b) a silicon dioxide, oxynitride or silicon nitride antifuse layer formed above the first metal layer; and (c) a second metal layer formed above the antifuse layer. The contiguous p-i-n diode and the MIM antifuse stack are arranged electrically in series between a first conductor and a second conductor. Numerous other aspects are provided.

Other features and aspects of the present invention will become more fully apparent from the following detailed description, the appended claims and the accompanying drawings.

DETAILED DESCRIPTION

Figure 1:
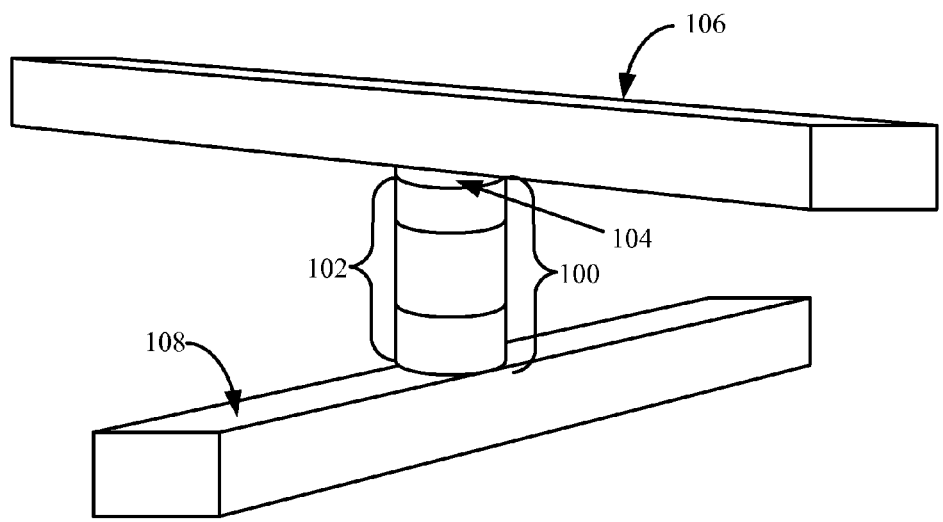
FIG. 1 is a perspective view of the memory cell of U.S. Pat. No. 6,952,030.

FIG. 1 shows an embodiment of a memory cell described in Herner et al., U.S. Pat. No. 6,952,030, "High-density three-dimensional memory cell," hereinafter the '030 patent. In this nonvolatile memory cell, pillar 100 includes a diode 102 and a dielectric rupture antifuse 104 arranged electrically in series between top conductor 106 and bottom conductor 108. In the initial state of this memory cell, when a read voltage is applied between top conductor 106 and bottom conductor 108 very little current flows between them. Application of a relatively large programming voltage permanently alters the memory cell of FIG. 1 so that, after programming, much more current flows at the same read voltage. This difference in current under the same applied read voltage allows a programmed cell to be distinguished from an unprogrammed cell; for example for a data "0" to be distinguished from a data "1".

As described in detail in Herner et al., U.S. patent application Ser. No. 10/955,549, "Nonvolatile Memory Cell Without a Dielectric Antifuse Having High- and Low-Impedance States," filed Sep. 29, 2004 and hereinafter the '549 application; and in Herner et al., U.S. patent application Ser. No. 11/148,530, "Nonvolatile Memory Cell Operating by Increasing Order in Polycrystalline Semiconductor Material," filed Jun. 8, 2005, and hereinafter the '530 application, both owned by the assignee of the present invention and hereby incorporated by reference herein in their entirety, diode 102 is formed of semiconductor material which, in the initial, unprogrammed device, is in a relatively high-resistivity state. Application of a programming voltage across diode 102 changes the semiconductor material from a high-resistivity state to a lower-resistivity state.

In a cell like that shown in FIG. 1, the programming voltage must perform two tasks. It must convert the semiconductor material of diode 102 from a high-resistivity to a low-resistivity state, and must also cause the dielectric material of dielectric rupture antifuse 104 to undergo dielectric breakdown, during which at least one conductive path is permanently formed through dielectric rupture antifuse 104.

Figure 2:
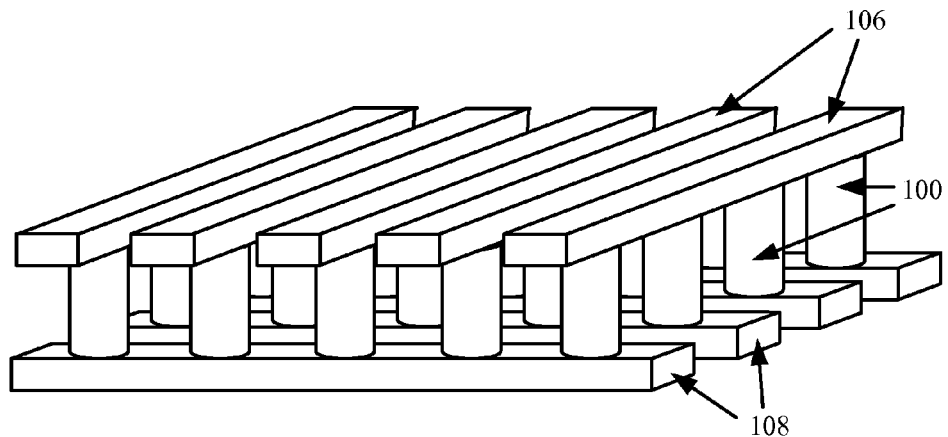
FIG. 2 is a perspective view of a memory level comprising memory cells.

FIG. 2 shows a portion of a first memory level of cells like those of FIG. 1 arranged in a cross-point array comprising a plurality of memory cells. Each memory cell comprises a pillar 100 (which comprises the diode 102 and antifuse 104 shown in FIG. 1), disposed between one of top conductors 106 and one of bottom conductors 108. Top conductors 106 are above bottom conductors 108 and extend in a different direction, preferably perpendicular to the bottom conductors 108. Two, three, or more such memory levels can be vertically stacked atop one another, forming a monolithic three dimensional memory array.

Figure 3:
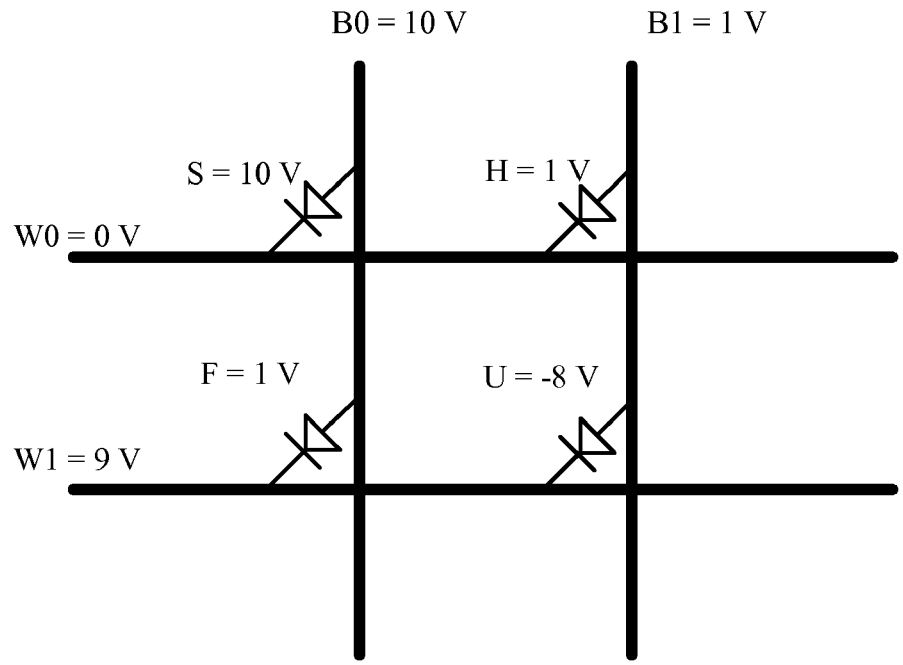
FIG. 3 is a circuit diagram showing a biasing scheme for programming selected cell S while avoiding inadvertent programming of half-selected cells H and F and unselected cell U in a cross-point array.

FIG. 3 illustrates a biasing scheme that may be used to program a memory cell in a cross-point memory array like that shown in FIG. 2. Suppose selected cell S is to be subjected to a programming voltage of 10 volts (the voltages supplied here are examples only). Selected bitline B0 is set at 10 volts and selected wordline W0 at 0 volts, placing 10 volts across selected cell S. To avoid inadvertent programming of cell F, which shares bitline B0 with selected cell S, unselected wordline W1 is set to 9 volts; thus cell F is subjected to only 1 volt, which is below the turn-on voltage for the diode of cell F. Similarly, unselected bitline B1 is set to 1 volt; thus cell H, which shares wordline W0 with selected cell S, is subjected to only 1 volt. Unselected cell U, which shares neither wordline nor bitline with selected cell S, is subjected to −8 volts. Note that in this simplified figure, only one unselected bitline B1 and only one unselected wordline W1 are shown. In reality there will be many unselected wordlines and bitlines. An array with N bitlines and M wordlines will include N−1 F cells, M−1 H cells, and a very large number (N−1)*(M−1) of U cells.

The diode in each of the U cells is under reverse bias at a voltage below the diode's breakdown voltage, minimizing the current that flows through this cell. (A diode conducts current asymmetrically, conducting current more readily in one direction than in the other.) There will inevitably be some reverse leakage current, however, and due to the large number of U cells, the reverse leakage current during programming of the selected cell may waste significant power. During programming of the selected cell S, the forward current on H cells and F cells that have been programmed, though small, similarly wastes power. Additionally, a high programming voltage itself is often difficult to generate. For all of these reasons, it is desirable to minimize the magnitude of the electrical pulse required to program the selected memory cell in such a cross-point memory array.

Feature size is the smallest feature that can be formed by a photolithographic process. Note that for horizontally oriented devices such as transistors, as feature size decreases, in general, voltages required to operate the devices also decrease. In the memory cell of FIG. 1, however, because of the vertical orientation of the memory cell, in general, the magnitude of electrical pulse required to transform the semiconductor material of the diode 102 and to rupture the antifuse 104 does not decrease with feature size.

In the '510 application, a dielectric rupture antifuse is paired with a semiconductor diode formed of semiconductor material, for example silicon, where the semiconductor material of the diode is in a low-resistivity state as formed, and need not be converted from a high- to a low-resistivity state.

The diode of the '030 patent and the '549 application is formed by depositing a semiconductor material such as silicon in an amorphous state, then performing a thermal anneal to crystallize the silicon, forming a polycrystalline silicon or polysilicon diode. As described in the '530 application, when deposited amorphous silicon is crystallized in contact solely with materials with which it has a high lattice mismatch, such as silicon dioxide and titanium nitride, the polysilicon forms with a high number of crystalline defects, causing it to be high-resistivity. Application of a programming pulse through this high-defect polysilicon apparently alters the polysilicon, causing it to be lower-resistivity.

It has been found, however, that when deposited amorphous silicon is crystallized in contact with a layer of an appropriate silicide, for example titanium silicide or cobalt silicide, the resulting crystallized silicon is much higher quality, with fewer defects, and has much lower resistivity. The lattice spacing of titanium silicide or cobalt silicide is very close to that of silicon, and it is believed that when amorphous silicon is crystallized in contact with a layer of an appropriate silicide at a favorable orientation, the silicide provides a template for crystal growth of silicon, minimizing formation of defects. The process may minimize the formation of grain boundaries to the point where a vertical diode formed from the silicon may have only a single grain, especially for diodes of small lateral size. Unlike the high-defect silicon crystallized adjacent only to materials with which it has a high lattice mismatch, application of a large electrical pulse does not appreciably change the resistivity of this low-defect, low-resistivity silicon crystallized in contact with the silicide layer.

By pairing a dielectric rupture antifuse with such a low-defect, low-resistivity diode, a memory cell can be formed in which the programming pulse need only be sufficient to rupture the dielectric rupture antifuse (as the diode is formed of semiconductor material which in its initial state is already low-resistivity and does not need to undergo a high-resistivity-to-low-resistivity conversion).

In embodiments of the '510 application, a low-defect, low-resistivity diode is paired with a dielectric rupture antifuse formed of a conventional dielectric material, such as silicon dioxide, that is positioned above the diode. In embodiments of the present invention, a low-defect, low-resistivity diode is paired with a dielectric rupture antifuse formed of a conventional dielectric material such as silicon dioxide, oxynitride or silicon nitride that is positioned below the diode (e.g., in a metal-insulator-metal (MIM) "antifuse" stack). The low-defect, low-resistivity diode is formed from deposited semiconductor material crystallized adjacent a silicide of a favorable orientation and/or lattice spacing (as described above). The term "deposited semiconductor material" refers to semiconductor materials such as silicon, germanium, and/or silicon-germanium alloys that have been deposited, and excludes a monocrystalline substrate above which a device may be built. As used herein, a metal-insulator-metal (MIM) antifuse stack may include one or more layers in addition to two metal layers which "sandwich" an insulator. For example, in some embodiments, an MIM antifuse stack may include an additional silicon layer that is formed over a bottom metal layer and oxidized and/or nitrided to form an insulating layer. A top metal layer may then be formed over the insulating layer. For convenience, such a structure is also referred to herein as an MIM antifuse stack (rather than as a metal-semiconductor-insulator-metal (MSIM) stack).

The voltage required to program the inventive memory cell is only that required to rupture the antifuse by subjecting it to dielectric breakdown.

In some embodiments, an antifuse is formed by depositing a silicon layer and then oxidizing the silicon layer to form a silicon dioxide antifuse. Alternatively, the silicon layer may be nitrided in ammonia or another nitriding species to form a silicon nitride antifuse. In other embodiments, a silicon dioxide and/or silicon nitride antifuse may be directly deposited, such as by atomic layer deposition (ALD).

Exemplary thicknesses for a silicon dioxide antifuse range from about 8 to 30 angstroms and more preferably from about 16 to 18 angstroms for a silicon dioxide antifuse formed by oxidizing a deposited silicon layer, and from about 12 to 14 angstroms for ALD deposited silicon dioxide. (Note that a silicon dioxide antifuse layer may also be nitrided by annealing in a nitrogen source such as ammonia or nitrous oxide before, during or after oxide formation, thereby forming an oxynitride antifuse.) Exemplary thicknesses for a silicon nitride antifuse range from about 10 to 40 angstroms. These thin antifuse layers may have high leakage currents and may require a lower voltage to break down (e.g., about 4.5 to 6 volts).

In one or more embodiments of the invention, antifuses are formed using relatively low temperature processes (e.g., about 300 to 700° C.). For example, antifuse formation may include a low temperature deposition process for silicon, such as plasma assisted chemical vapor deposition (CVD), followed by a low temperature oxidation process, such as low temperature rapid thermal oxidation (RTO). Similarly, a low temperature deposition process, such as ALD, may be used to form silicon dioxide directly. As a general rule, reducing processing temperature is advantageous in fabrication of a complex semiconductor device, minimizing dopant diffusion, peeling, etc.

Figure 4:
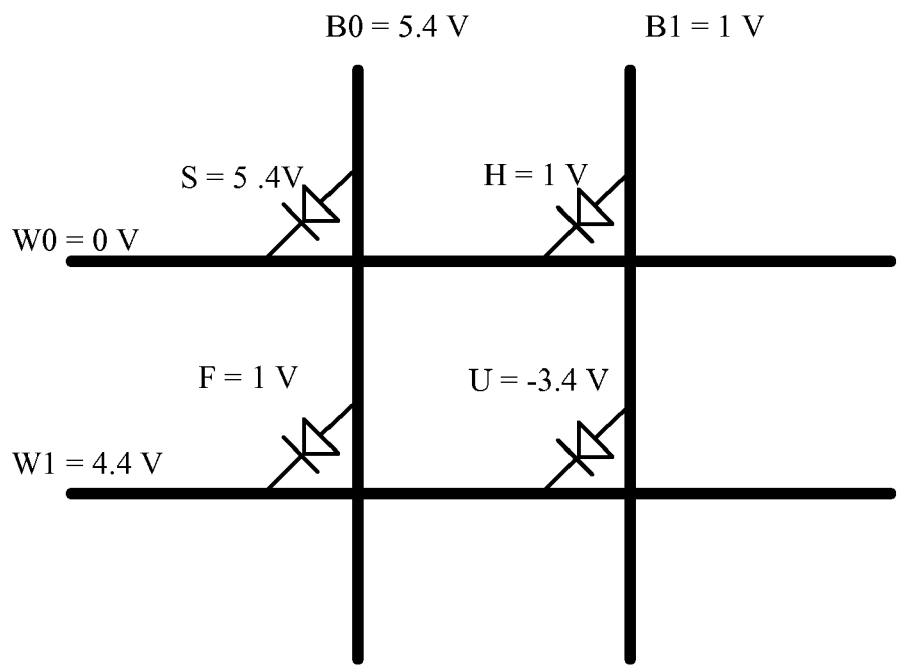
FIG. 4 is a circuit diagram showing voltages across the selected cell S, half-selected cells H and F, and unselected cell U at reduced programming voltage in a cross-point array.

A diode conducts current asymmetrically, conducting more readily under forward bias than under reverse bias. Reverse leakage current, the current that flows under reverse bias, is undesirable. Reverse leakage current reduces superlinearly with reduced negative voltage across the diode. For example, in an exemplary diode having a feature size of 0.15 microns formed of low-resistivity semiconductor material, as in the present invention, when the diode was biased with −7 volts, the reverse leakage current was $-7.5 \times 10^{-11}$ amps. When bias voltage was −5.5 volts, the reverse leakage current was substantially reduced to $-3.0 \times 10^{-1}$ amps. Under a bias voltage of −4.5 volts, reverse leakage current was reduced to $-1.6 \times 10^{-1}$ amps. In the cross-point array pictured in FIG. 2, recall that lower voltage required to program the selected cell S results in lower negative voltage across unselected cells U. For example, turning to FIG. 4, suppose the programming voltage on selected cell S need be only 5.4 volts. The voltage on selected bitline B0 is 5.4 volts, and selected wordline W0 is at 0 volts, for 5.4 volts across selected cell S. If unselected bitline B1 is set to 1 volt and unselected wordline W1 is set to 4.4 volts, cells H and F are both subjected to 1 volt. Unselected cell U is subjected −3.4 volts, significantly lower than −8 volts as in the example of FIG. 3.

In the monolithic memory arrays so far described, silicon has generally been preferred to form the diode. Germanium has a smaller band gap than silicon, and it has been found that a diode formed of an alloy of silicon and germanium has higher reverse leakage current than a pure silicon diode. The leakage current increases with the fraction of germanium. In a cross-point memory array, with unselected cells U at only −3.4 volts, the leakage current will be substantially less, mitigating this disadvantage. For example, by lowering the programming voltage of a memory cell, "leakier" diode materials, such as silicon-germanium (SiGe) alloy, may be useable. SiGe diodes have lower turn on voltages, and thus require smaller read voltages (which reduces the overall voltages used by a memory array, reducing the need for large charge pump transistors and reducing die size). As described in Herner et al., U.S. patent application Ser. No. 11/125,606, "High-Density Nonvolatile Memory Array Fabricated at Low Temperature Comprising Semiconductor Diodes," filed May 9, 2005, owned by the assignee of the present invention and hereby incorporated by reference herein in its entirety and hereinafter the '606 application, the temperature required to deposit and crystallize silicon by conventional methods is generally incompatible with aluminum and copper metallization, which cannot tolerate high temperature. As described in the '606 application, use of silicon-germanium (SiGe) diodes with sufficiently high germanium content lowers overall fabrication temperature, allowing use of these low-resistivity metals, improving device performance.

Figure 5:
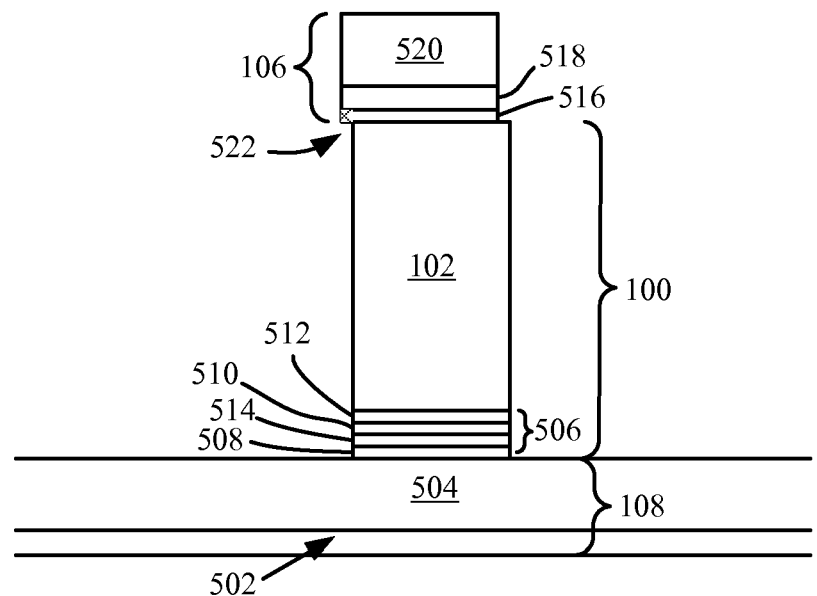
FIG. 5 is a cross-sectional view of a memory cell formed according to an exemplary embodiment of the present invention.

FIG. 5 shows a memory cell formed according to an exemplary embodiment of the present invention. With reference to FIG. 5, bottom conductor 108 includes adhesion layer 502, preferably of titanium nitride, and conductive layer 504, preferably of tungsten. Other adhesion layer materials and/or other conductive layer materials may be used (e.g., tantalum nitride, tungsten nitride or other adhesion layer materials, tantalum, titanium or other conductive layer materials. An MIM antifuse stack 506 is formed above the bottom conductor 108. For example, the MIM antifuse stack 506 may includes a first metal layer 508 formed above the bottom conductor 108, a dielectric rupture antifuse 510 formed above the first metal layer 508 and a second metal layer 512 formed above the dielectric rupture antifuse 510. In at least one embodiment, the first and second metal layers 508 and 512 may include tantalum nitride, tungsten nitride, titanium nitride, or the like. The dielectric rupture antifuse 510 may be formed from silicon dioxide (with or without nitridation), silicon nitride (with or without oxidation) or a similar conventional dielectric. As stated previously, in some embodiments, the antifuse 510 may be directly formed by a deposition process such as ALD. In other embodiments, a silicon layer 514 may be formed above the first metal layer 508 and then oxidized and/or nitrided to form either silicon dioxide, oxynitride or silicon nitride that serves as the antifuse 510 (as shown in FIG. 5).

Vertically oriented contiguous p-i-n diode 102 is formed above the MIM antifuse stack 506, and pillar 100 includes both the MIM antifuse stack 506 and the diode 102. Silicide layer 516, which is preferably cobalt silicide or titanium silicide, is part of top conductor 106, which further includes conductive layers such as, for example, titanium nitride layer 518 and tungsten layer 520. (As will be seen, silicide is only formed where a silicide-forming metal is in contact with the silicon of diode 102; the cross-hatched portion 522 of layer 516 is unreacted metal, not silicide.) Top conductor 106, which is shown slightly misaligned with underlying pillar 100, is preferably rail-shaped, shown in cross-section extending out of the page. The silicon of diode 102 is preferably deposited amorphous, then crystallized. In some embodiments, it may be preferred to crystallize diode 102, then strip silicide 516 so it is not present in the finished device. Additional layers which are not shown may be present, such as barrier layers and adhesion layers; alternatively, some barrier layers which are included may be omitted in some embodiments.

Figure 6:
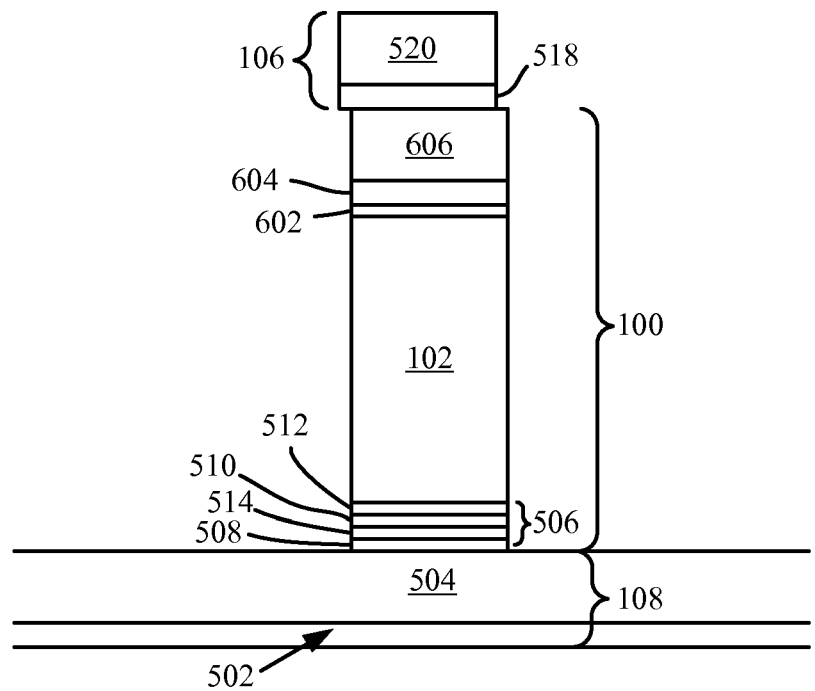
FIG. 6 is a cross-sectional view of a memory cell formed according to an alternative embodiment of the present invention.

FIG. 6 shows an alternative embodiment of the memory cell of FIG. 5. Bottom conductor 108, MIM antifuse stack 506 and diode 102 are formed as in the embodiment of FIG. 5. However, in the embodiment of FIG. 6, a silicide-forming metal layer 602 and a metal hard mask may be formed over the diode 102 prior to formation of the pillar 100 (e.g., prior to the etch step used to form the pillar 100, as described further below with reference to FIGS. 8A-C). For example, a silicide-forming metal layer 602, such as titanium or cobalt, may be formed above the diode 102. Thereafter, a barrier layer 604 and/or a conductive layer 606 may be formed over the silicide-forming metal layer 602. The barrier layer 604 may include titanium nitride, tantalum nitride, tungsten nitride, etc., and the conductive layer 606 may include tungsten or another suitable metal layer. The barrier layer 604 and/or conductive layer 606 may serve as a hard mask during formation of the diode 102 and may mitigate any overetching that may occur during formation of the top conductor 106 (as described in the U.S. patent application Ser. No. 11/444,936, filed May 13, 2006 and titled "CONDUCTIVE HARD MASK TO PROTECT PATTERNED FEATURES DURING TRENCH ETCH" (hereinafter "the '936 application") which is hereby incorporated by reference herein in its entirety). For example, the barrier layer 604 and conductive layer 606 may be patterned and etched, and then serve as a mask during etching of the diode 102 and MIM antifuse stack 506. Etching of the conductive layer 606, barrier layer 604, silicide-forming metal layer 602, diode 102 and MIM antifuse stack 506 creates pillar structure 100. In some embodiments, such etching may be performed in a single etch step. As will be described below, dielectric material is deposited on top of and around the pillar structure 100 so as to isolate the pillar structure 100 from other similar pillar structures of other memory cells (not shown) fabricated on a memory level that includes the memory cell. A chemical mechanical polish (CMP) or dielectric etchback step then is performed to planarize the dielectric material, prior to formation of the top conductor 106.

Following formation of the top conductor 106, the memory cell may be annealed to crystallize the deposited semiconductor material of the diode 102 (and/or to form a silicide layer by interaction of the silicide-forming metal layer 602 and the diode 102). In at least one embodiment, the anneal may be performed for about 10 seconds to about 2 minutes in nitrogen at a temperature of about 600 to 800° C., and more preferably between about 650 and 750° C. Other annealing times, temperatures and/or environments may be used. The resultant silicide layer may serve as a "crystallization template" or "seed" during annealing for underlying deposited semiconductor material that forms the diode 102. Lower resistivity diode material thereby is provided.

Figure 7:
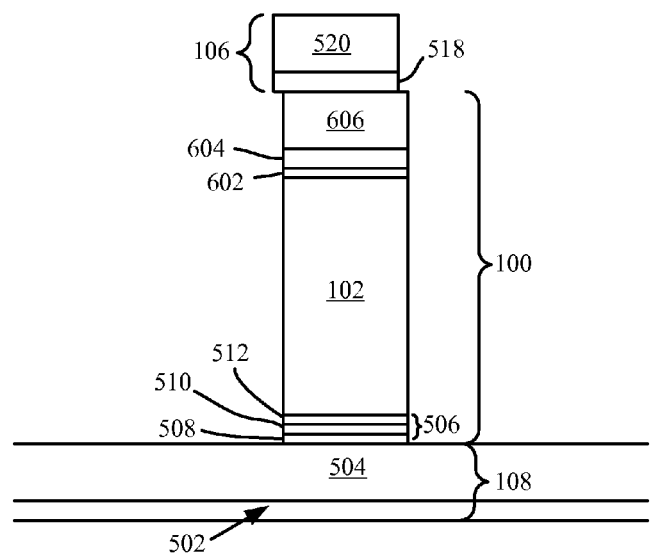
FIG. 7 is a cross-sectional view of a memory cell formed according to another alternative embodiment of the present invention.

FIG. 7 shows an alternative embodiment of the memory cell of FIG. 6. The memory cell of FIG. 7 is similar to the memory cell of FIG. 6, with the exception that in the memory cell of FIG. 7, the MIM antifuse stack 506 is formed by directly depositing the antifuse layer 510 above the first metal layer 508. For example, the antifuse layer 510 may be formed by depositing silicon dioxide, silicon nitride or silicon oxynitride over the first metal layer 508. Any suitable deposition process may be used, such as ALD or the like. In this manner, the deposited silicon layer 514 may be eliminated (as shown).

Each of these embodiments is a semiconductor device comprising (1) a contiguous p-i-n diode formed of deposited semiconductor material, wherein the semiconductor material is crystallized adjacent to a silicide, germanide, or silicide-germanide layer; and (2) a dielectric rupture antifuse arranged electrically in series with the diode. In each embodiment, the vertically oriented diode is disposed between a bottom conductor and a top conductor, and the dielectric rupture antifuse is disposed between the diode and the bottom conductor. In these examples, neither the top nor the bottom conductor comprises a silicon layer.

The term "contiguous p-i-n diode" describes a diode formed of semiconductor material which has heavily doped p-type semiconductor material at one end and heavily doped n-type semiconductor material at the other, with intrinsic or lightly doped semiconductor material between, with no dielectric rupture antifuse present between the p-type region and the n-type region that prevents most current flow before the antifuse is ruptured. A p-i-n diode is preferred for use in a large memory array because such a diode minimizes leakage current under reverse bias.

In any of these cells, before programming, the antifuse 510 is intact and impedes current flow. During programming, when a programming voltage is supplied between top conductor 106 and bottom conductor 108, a portion of the dielectric rupture antifuse suffers dielectric breakdown, forming a conductive path through the dielectric rupture antifuse 510 between the contiguous p-i-n diode 102 and the bottom conductor 108.

A detailed example will be provided of formation of a monolithic three dimensional memory array formed according to embodiments of the present invention. For completeness, specific process conditions, dimensions, methods, and materials will be provided. It will be understood, however, that such details are not intended to be limiting, and that many of these details can be modified, omitted or augmented while the results still fall within the scope of the invention. For example, some details from the '030 patent, and the '549, '530, and '510 applications may be useful. To avoid obscuring the invention, all details from this patent and these applications have not been included, but it will be understood that no relevant teaching is intended to be excluded.

Exemplary Fabrication Process

Figure 8A:
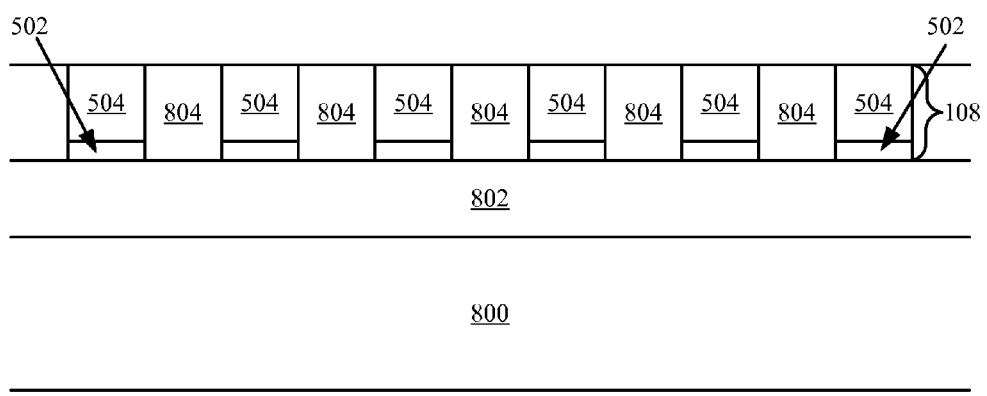
FIGS. 8A-8C are cross-sectional views showing stages in formation of a first memory level of a monolithic three dimensional memory array formed according to an exemplary embodiment of the present invention.

Turning to FIG. 8A, formation of an exemplary memory begins with a substrate 800. This substrate 800 may be any semiconducting substrate known in the art, such as monocrystalline silicon, IV-IV compounds like silicon-germanium or silicon-germanium-carbon, III-V compounds, II-VI compounds, epitaxial layers over such substrates, or any other semiconducting material. The substrate 800 may include integrated circuits fabricated therein.

An insulating layer 802 is formed over substrate 800. The insulating layer 802 may be silicon dioxide, silicon nitride, Si—C—O—H film, or any other suitable insulating material.

The first (bottom) conductors 108 are formed over the substrate 800 and insulator 802. Adhesion layer 502 may be included between the insulating layer 802 and the conducting layer 504 to help conducting layer 504 adhere to insulating layer 802. If the overlying conducting layer 504 is tungsten, titanium nitride is preferred as adhesion layer 502. Conducting layer 504 can comprise any conducting material known in the art, such as tungsten, or other materials, including tantalum, titanium, copper, cobalt, or alloys thereof.

Once all the layers that will form the conductor rails 108 have been deposited, the layers are patterned and etched using any suitable masking and etching process to form substantially parallel, substantially coplanar conductors 108, shown in FIG. 8A in cross-section. Conductors 108 extend out of the page. In one embodiment, photoresist is deposited on the conductive layer 504 and patterned by photolithography, the layers 502 and 504 are etched, and then the photoresist is removed using standard process techniques.

Next a dielectric material 804 is deposited over and between conductor rails 108. Dielectric material 804 can be any known electrically insulating material, such as silicon dioxide, silicon nitride, or silicon oxynitride. In a preferred embodiment, silicon dioxide deposited by a high-density plasma method is used as dielectric material 804.

Finally, excess dielectric material 804 on top of conductor rails 108 is removed, exposing the tops of conductor rails 108 separated by dielectric material 804, and leaving a substantially planar surface. The resulting structure is shown in FIG. 8A. This removal of dielectric overfill to form the planar surface can be performed by any process known in the art, such as CMP or etchback. In an alternative embodiment, conductors 108 could be formed by a Damascene method instead.

Figure 8B:
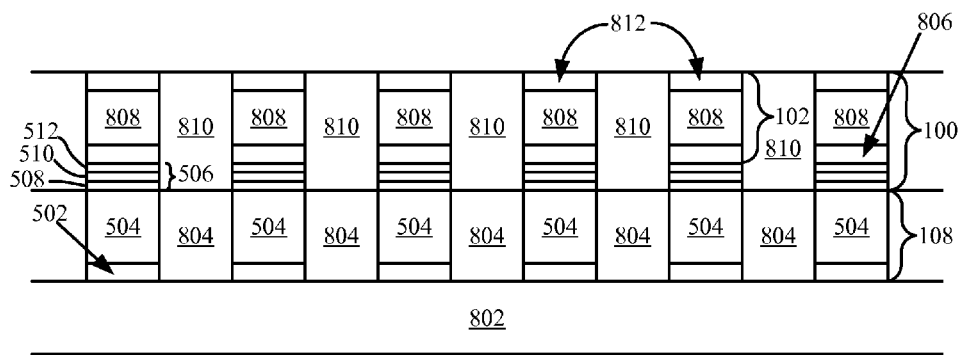

Turning to FIG. 8B, the MIM antifuse stack 506 is formed over the bottom conductor rails 108. For example, first metal layer 508 may be formed above the bottom conductors 108, dielectric rupture antifuse 510 may be formed above the first metal layer 508 and second metal layer 512 may be formed above the dielectric rupture antifuse 510. In at least one embodiment, the first and second metal layers 508 and 512 may include tantalum nitride, tungsten nitride, titanium nitride, or the like. For example, the first and second metal layers 508 and 512 may comprise about 10 to 300 angstroms, and more preferably about 50 angstroms, of titanium nitride (although other materials and/or thicknesses may be used).

The dielectric rupture antifuse 510 may be formed from silicon dioxide (with or without nitridation), silicon nitride (with or without oxidation) or a similar conventional dielectric. As stated previously, in some embodiments, the antifuse 510 may be directly formed by a deposition process such as ALD. In other embodiments, a silicon layer (not shown in FIG. 8B, such as layer 514 in FIG. 5) may be formed above the first metal layer 508 and then oxidized and/or nitrided to form either silicon dioxide, oxynitride or silicon nitride that serves as the antifuse 510 (as shown in FIG. 5). In some embodiments, the silicon layer may be about 40 to 500 angstroms thick, and more preferably about 100 angstroms thick, although other layer thicknesses may be employed.

Exemplary thicknesses for a silicon dioxide antifuse range from about 8 to 30 angstroms and more preferably from about 16 to 18 angstroms for a silicon dioxide antifuse formed by oxidizing a deposited silicon layer, and from about 12 to 14 angstroms for ALD deposited silicon dioxide. (Note that a silicon dioxide antifuse layer may also be nitrided by annealing in a nitrogen source such as ammonia or nitrous oxide before, during or after oxide formation, thereby forming an oxynitride antifuse.) Exemplary thicknesses for a silicon nitride antifuse range from about 10 to 40 angstroms. These thin antifuse layers may have low leakage currents and may require a lower voltage to break down (e.g., about 4.5 to 6 volts).

In one or more embodiments of the invention, antifuses are formed using relatively low temperature processes (e.g., about 300 to 700° C.). For example, antifuse formation may include a plasma-assisted CVD process followed by a low temperature oxidation process, such as low temperature rapid thermal oxidation (RTO). Similarly, a low temperature deposition process, such as ALD, may be used to form silicon dioxide directly.

In some embodiments, antifuse layer 510 is formed directly by depositing the antifuse layer or by depositing silicon and then oxidizing and/or nitriding the deposited silicon. A high-quality film is preferably dense, as close to its theoretical density as possible; has complete coverage with few or no pinholes; and has a low density of electrical defects.

Next semiconductor material that will be patterned into pillars is deposited. The semiconductor material can be silicon, germanium, a silicon-germanium alloy, or other suitable semiconductors, or semiconductor alloy. For simplicity, this description will refer to the semiconductor material as silicon, but it will be understood that the skilled practitioner may select any of these other suitable materials instead.

Bottom heavily doped region 806 can be formed by any deposition and doping method known in the art. The silicon can be deposited and then doped, but is preferably doped in situ by flowing a donor gas providing n-type dopant atoms, for example phosphorus, during deposition of the silicon. Heavily doped region 806 is preferably between about 100 and about 800 angstroms thick, although other thicknesses may be used.

Intrinsic region 808 can be formed by any method known in the art. Region 808 can be silicon, germanium, or any alloy of silicon or germanium and in some embodiments has a thickness between about 1100 and about 3300 angstroms, preferably about 2000 angstroms. Other thicknesses may be used. The silicon of heavily doped region 806 and intrinsic region 808 is preferably amorphous as deposited.

In some embodiments, a thin (e.g., a few hundred angstroms or less) germanium and/or silicon-germanium alloy layer (not shown), with about 10 at % or more of germanium when using a silicon-germanium alloy layer, may be formed on the n+ region 806 to prevent and/or reduce dopant migration from the n+ region 806 into the intrinsic region 808, as described, for example, in U.S. patent application Ser. No. 11/298,331, filed Dec. 9, 2005 and titled "DEPOSITED SEMICONDUCTOR STRUCTURE TO MINIMIZE N-TYPE DOPANT DIFFUSION AND METHOD OF MAKING" (hereinafter "the '331 application"), which is hereby incorporated by reference herein in its entirety for all purposes.

Semiconductor regions 808 and 806 just deposited, along with underlying MIM antifuse stack 506 are patterned and etched to form pillars 100. Pillars 100 should have about the same pitch and about the same width as conductors 108 below, such that each pillar 100 is formed on top of a conductor 108. Some misalignment can be tolerated.

Pillars 100 may be formed using any suitable masking and etching process. For example, photoresist can be deposited and patterned using standard photolithography techniques, the pillars 100 etched, and then the photoresist removed. Alternatively, a hard mask of some other material, for example silicon dioxide, can be formed on top of the semiconductor layer stack, with bottom antireflective coating (BARC) on top, then patterned and etched and used as a mask to etch the pillars 100. Similarly, dielectric antireflective coating (DARC) can be used as a hard mask. Additionally, a metal hard mask may be used for etching the pillars 100 as described in the '936 application.

The photolithography techniques described in Chen, U.S. application Ser. No. 10/728,436, "Photomask Features with Interior Nonprinting Window Using Alternating Phase Shifting," filed Dec. 5, 2003; or Chen, U.S. application Ser. No. 10/815,312, Photomask Features with Chromeless Nonprinting Phase Shifting Window," filed Apr. 1, 2004, both owned by the assignee of the present invention and hereby incorporated by reference herein in their entirety, can advantageously be used to perform any photolithography step used in formation of a memory array according to the present invention.

Dielectric material 810 is deposited over and between the pillars 100, filling the gaps between them. Dielectric material 810 can be any known electrically insulating material, such as silicon dioxide, silicon nitride, or silicon oxynitride. In a preferred embodiment, silicon dioxide is used as the insulating material.

Next the dielectric material on top of pillars 100 is removed, exposing the tops of pillars 100 separated by dielectric material 810, and leaving a substantially planar surface. This removal of dielectric overfill can be performed by any process known in the art, such as CMP or etchback. After CMP or etchback, ion implantation is performed, forming heavily doped p-type top regions 812. The p-type dopant is preferably a shallow implant of boron, with an implant energy of, for example, 2 keV, and dose of about $3 \times 10^{15}/cm^2$. This implant step completes formation of diodes 102. Other dopant types and/or energies may be used. The resulting structure is shown in FIG. 8B. In the diodes just formed, bottom heavily doped regions 806 are n-type while top heavily doped regions 812 are p-type; clearly the polarity of the diodes could be reversed.

Summarizing, the pillars 100 are formed by depositing an MIM antifuse stack 506 and a semiconductor layer stack above the first conductors 108; and patterning and etching the MIM antifuse stack 506 and semiconductor layer stack in the form of pillars 100 in a single patterning step. After completion of the device, a contiguous p-i-n diode, in series with an MIM antifuse stack 506, is disposed within each pillar 100.

Figure 8C:
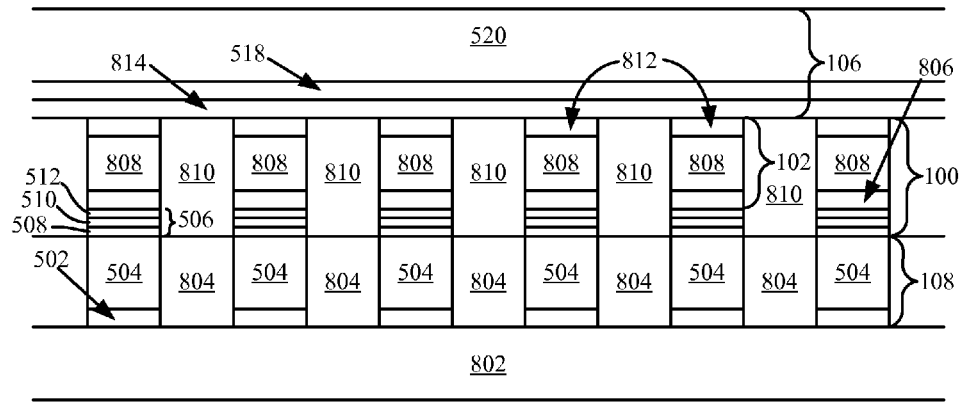

Turning to FIG. 8C, after cleaning any native oxide that has formed on tops of pillars 100, a layer 814 of a silicide-forming metal, for example titanium or cobalt is deposited. Layer 814 is preferably titanium or cobalt; if layer 814 is titanium, its thickness is preferably between about 10 and about 100 angstroms, most preferably about 20 angstroms although other thicknesses may be used. Layer 814 is followed by barrier and/or adhesion layer 518 (e.g., a titanium nitride layer). Layer 518 is preferably between about 20 and about 100 angstroms, most preferably about 50 angstroms. Other layer thicknesses may be employed. Next a layer 520 of a conductive material, for example tungsten, is deposited. Layers 520, 518, and 814 are patterned and etched into rail-shaped top conductors 106, which preferably extend in a direction perpendicular to bottom conductors 108.

Next a dielectric material (not shown) is deposited over and between conductors 106. The dielectric material can be any known electrically insulating material, such as silicon dioxide, silicon nitride, or silicon oxynitride. In a preferred embodiment, silicon dioxide is used as this dielectric material.

Formation of a first memory level has been described. Additional memory levels can be formed above this first memory level to form a monolithic three dimensional memory array. The array just described is just one example;

and may vary in other ways, for example including either of the memory cells shown in FIGS. 6 and 7.

Referring to FIG. 8C, note that layer 814 of a silicide-forming metal is in contact with the silicon of top heavily doped region 812. During subsequent elevated temperature steps, the metal of layer 814 will react with some portion of the silicon of heavily doped region 812 to form a silicide layer (not shown). This silicide layer forms at a temperature lower than the temperature required to crystallize silicon, and thus will form while regions 806, 808, and 812 are still largely amorphous. If a silicon-germanium alloy is used for top heavily doped region 812, a silicide-germanide layer may form, for example of cobalt silicide-germanide or titanium silicide-germanide.

Preferably after all of the memory levels have been formed, a single crystallizing anneal is performed to crystallize diodes 102, for example at 750 degrees C. for about 60 seconds, although each memory level can be annealed as it is formed. The resulting diodes will generally be polycrystalline. Since the semiconductor material of these diodes is crystallized in contact with a silicide or silicide-germanide layer with which it has a good lattice match, the semiconductor material of diodes 102 will be low-defect and low-resistivity. However, as feature sizes decrease, and grain boundary densities are minimized, the diodes may include only single grains.

In some embodiments, conductors can be shared between memory levels; i.e. top conductor 106 may serve as the bottom conductor of the next memory level above as described, for example, in U.S. patent application Ser. No. 11/692,151, filed Mar. 27, 2007 and titled "LARGE ARRAY OF UPWARD POINTING P-I-N DIODES HAVING LARGE AND UNIFORM CURRENT" (hereinafter "the '151 application"), which is hereby incorporated by reference herein in its entirety for all purposes. In other embodiments, an interlevel dielectric (not shown) may be formed above the first memory level of FIG. 8C, its surface planarized, and construction of a second memory level may begin on this planarized interlevel dielectric, with no shared conductors.

The present invention allows for a reduction in programming voltage. In embodiments of the '030 patent, a programming voltage sufficient to program nearly all (more than 99 percent, for example) of the cells in an array includes a pulse across the cell to be programmed of at least 8 volts. In embodiments of the present invention, like the array just described, programming voltage can be reduced. For example, nearly all of the cells in an array can be programmed with a programming pulse less than about 8 volts, and in some embodiments less than 6 volts, or less than 4.0 volts.

In some embodiments, it may be preferred for the programming pulse to be applied with the diode in reverse bias. This may have advantages in reducing or eliminating leakage across the unselected cells in the array, as described in Kumar et al., U.S. patent application Ser. No. 11/496,986, "Method For Using A Memory Cell Comprising Switchable Semiconductor Memory Element With Trimmable Resistance," filed Jul. 28, 2006, owned by the assignee of the present invention and hereby incorporated by reference.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

An alternative method for forming a similar array in which conductors are formed using Damascene construction is described in the '936 application, previously incorporated. The methods of the '936 application may be used instead to form an array according to the present invention.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

The invention claimed is:

1. A method for forming a non-volatile memory cell, the method comprising:
   forming a metal-insulator-metal (MIM) antifuse stack including:
      a first metal layer;
      a silicon dioxide, oxynitride or silicon nitride antifuse layer formed above the first metal layer; and
      a second metal layer formed above the antifuse layer;
   forming a contiguous p-i-n diode above the MIM antifuse stack, the contiguous p-i-n diode comprising deposited semiconductor material;
   forming a layer of a silicide, silicide-germanide, or germanide in contact with the deposited semiconductor material at a temperature lower than a temperature required to crystallize silicon or germanium; and
   after forming the silicide, silicide-germanide, or germanide layer, crystallizing the deposited semiconductor material in contact with the layer of silicide, silicide-germanide, or germanide;
   wherein the memory cell comprises the contiguous p-i-n diode and the MIM antifuse stack.

2. The method of claim 1 wherein the antifuse layer is formed using atomic layer deposition.

3. The method of claim 1 wherein the antifuse layer is formed by:
   depositing a layer of silicon above the first metal layer; and
   oxidizing the layer of silicon to form silicon dioxide.

4. The method of claim 3 further comprising nitriding the silicon dioxide to form oxynitride.

5. The method of claim 1 wherein the antifuse layer is formed by:
   depositing a layer of silicon above the first metal layer; and
   nitriding the layer of silicon to form silicon nitride.

6. The method of claim 5 further comprising oxidizing the silicon nitride.

7. The method of claim 1 wherein the antifuse layer is formed by:
   depositing a layer of silicon above the first metal layer; and
   oxynitriding the layer of silicon to form silicon oxynitride.

8. The method of claim 1 wherein the antifuse layer is about 40 angstroms thick or less.

9. The method of claim 8 wherein the antifuse layer is about 18 angstroms thick or less.

10. The method of claim 1 wherein at least one of the first metal layer and the second metal layer comprises titanium nitride, tantalum nitride or tungsten nitride.

11. The method of claim 1 wherein the deposited semiconductor material comprises silicon, germanium, or a silicon-germanium alloy.

12. The method of claim 1 wherein the silicide, silicide-germanide, or germanide is titanium silicide, titanium silicide-germanide, titanium germanide, cobalt silicide, cobalt silicide-germanide, or cobalt germanide.

13. The method of claim 1 wherein the contiguous p-i-n diode is disposed between a top conductor and a bottom conductor, and wherein the MIM antifuse stack is disposed between the contiguous p-i-n diode and the bottom conductor.

14. The method of claim 1 wherein the contiguous p-i-n diode is vertically oriented.

15. The method of claim 1
wherein the deposited semiconductor material is polycrystalline or single grained.

16. The method of claim 1 wherein forming the contiguous p-i-n diode comprises:
forming a bottom conductor;
after forming the bottom conductor, forming the MIM antifuse stack above the bottom conductor,
after forming the MIM antifuse stack, depositing a semiconductor layer stack above the MIM antifuse stack;
patterning and etching the semiconductor layer stack and MIM antifuse stack to form a pillar in a single patterning step; and
after patterning and etching the semiconductor layer stack and MIM antifuse stack, forming a second conductor above the pillar.

17. The method of claim 16 further comprising subjecting a portion of the antifuse layer to dielectric breakdown so as to program the memory cell.

18. The method of claim 17 wherein subjecting the portion of the antifuse layer to dielectric breakdown comprises applying a programming voltage between the first conductor and the second conductor.

19. The method of claim 18 wherein the programming voltage does not exceed about 7 volts.

20. A memory cell formed by the method of claim 1.

21. A method for monolithically forming a first memory level above a substrate, the method comprising:
forming a plurality of first substantially parallel, substantially coplanar conductors above the substrate, the first conductors extending in a first direction;
forming a plurality of MIM antifuse stacks above the first conductors, each MIM antifuse stack including:
a first metal layer;
a silicon dioxide, oxynitride or silicon nitride antifuse layer formed above the first metal layer; and
a second metal layer formed above the antifuse layer;
forming a plurality of vertically oriented contiguous p-i-n diodes above the MIM antifuse stacks, each contiguous p-i-n diode comprising semiconductor material crystallized in contact with a silicide, silicide-germanide, or germanide layer, wherein the layer of silicide, silicide-germanide or germanide is formed at a temperature lower than a temperature required to crystallize silicon or germanium, and wherein the deposited semiconductor material is crystallized after the silicide, silicide-germanide, or germanide layer is formed; and
forming a plurality of second substantially parallel, substantially coplanar conductors above the contiguous p-i-n diodes, the second conductors extending in a second direction different from the first direction, each contiguous p-i-n diode vertically disposed above one of the MIM antifuse stacks and between one of the first conductors and one of the second conductors.

22. The method of claim 21 wherein the antifuse layer of each MIM antifuse stack is formed by atomic layer deposition.

23. The method of claim 21 wherein the antifuse layer of each MIM antifuse stack is formed by:
depositing a layer of silicon above the first metal layer; and
oxidizing the layer of silicon to form silicon dioxide.

24. The method of claim 23 further comprising nitriding the silicon dioxide to form oxynitride.

25. The method of claim 21 wherein the antifuse layer is formed by:
depositing a layer of silicon above the first metal layer; and
nitriding the layer of silicon to form silicon nitride.

26. The method of claim 25 further comprising oxidizing the silicon nitride.

27. The method of claim 21 wherein the antifuse layer is formed by:
depositing a layer of silicon above the first metal layer; and
oxynitriding the layer of silicon to form silicon oxynitride.

28. The method of claim 21 wherein the semiconductor material comprises at least one of silicon, germanium, and a silicon-germanium alloy.

29. The method of claim 21 wherein the substrate comprises monocrystalline silicon.

30. The method of claim 21 wherein at least a second memory level is monolithically formed above the first memory level.

31. A first memory level formed by the method of claim 21.

32. A method for forming a monolithic three dimensional memory array above a substrate, the method comprising
(a) monolithically forming a first memory level above the substrate, the first memory level formed by:
(i) forming a plurality of first substantially parallel, substantially coplanar conductors extending in a first direction;
(ii) forming a plurality of second substantially parallel, substantially coplanar conductors extending in a second direction different from the first direction, the second conductors above the first conductors;
(iii) forming a plurality of vertically oriented contiguous p-i-n diodes formed of deposited semiconductor material, the deposited semiconductor material crystallized in contact with a silicide, silicide-germanide, or germanide layer, each diode vertically disposed between one of the first conductors and one of the second conductors, wherein the layer of silicide, silicide-germanide or germanide is formed at a temperature lower than a temperature required to crystallize silicon or germanium, and wherein the deposited semiconductor material is crystallized after the silicide, silicide-germanide, or germanide layer is formed;
(iv) forming a plurality of metal-insulator-metal (MIM) antifuse stacks each including:
a first metal layer;
a silicon dioxide, oxynitride or silicon nitride antifuse layer formed above the first metal layer; and
a second metal layer formed above the antifuse layer; and
(v) forming a plurality of memory cells, each memory cell comprising one of the diodes positioned above one of the MIM antifuse stacks arranged in series; and (b) monolithically forming a second memory level above the first memory level.

33. The method of claim 32 wherein the antifuse layer of each MIM antifuse stack is formed by atomic layer deposition.

34. The method of claim 32 wherein the antifuse layer of each MIM antifuse stack is formed by:
   depositing a layer of silicon above the first metal layer; and
   oxidizing the layer of silicon to form silicon dioxide.

35. The method of claim 34 further comprising nitriding the silicon dioxide to form oxynitride.

36. The method of claim 32 wherein the antifuse layer of each MIM antifuse stack is formed by:
   depositing a layer of silicon above the first metal layer; and
   nitriding the layer of silicon to form silicon nitride.

37. The method of claim 36 further comprising oxidizing the silicon nitride.

38. The method of claim 32 wherein the antifuse layer is formed by:
   depositing a layer of silicon above the first metal layer; and
   oxynitriding the layer of silicon to form silicon oxynitride.

39. The method of claim 32 wherein the deposited semiconductor material comprises at least one of silicon, germanium, and a silicon-germanium alloy.

40. The method of claim 32 wherein the substrate comprises monocrystalline silicon.

41. A monolithic three dimensional memory array formed by the method of claim 32.

* * * * *